United States Patent
Golonzka et al.

(10) Patent No.: US 8,716,806 B2
(45) Date of Patent: May 6, 2014

(54) METHODS OF CHANNEL STRESS ENGINEERING AND STRUCTURES FORMED THEREBY

(75) Inventors: Oleg Golonzka, Beaverton, OR (US); Hemant Deshpande, Beaverton, OR (US); Ajay K Sharma, Beaverton, OR (US); Cory Weber, Hillsboro, OR (US); Ashutosh Ashutosh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 13/458,198

(22) Filed: Apr. 27, 2012

(65) Prior Publication Data
US 2012/0211839 A1    Aug. 23, 2012

Related U.S. Application Data

(62) Division of application No. 12/316,955, filed on Dec. 17, 2008, now Pat. No. 8,193,049.

(51) Int. Cl.
*H01L 21/70*    (2006.01)

(52) U.S. Cl.
USPC .................. 257/369; 438/199; 257/E21.409; 257/E29.255

(58) Field of Classification Search
None
See application file for complete search history.

(56) References Cited

U.S. PATENT DOCUMENTS

| | | | |
|---|---|---|---|
| 7,494,906 B2 * | 2/2009 | Kammler et al. | 438/528 |
| 2007/0004114 A1 * | 1/2007 | Lee et al. | 438/197 |
| 2007/0254444 A1 * | 11/2007 | Bloomquist et al. | 438/305 |

* cited by examiner

*Primary Examiner* — Sonya D McCall Shepard
(74) *Attorney, Agent, or Firm* — Forefront IP Lawgroup, PLLC

(57) ABSTRACT

Methods and associated structures of forming a microelectronic device are described. Those methods may include forming a source/drain region in an NMOS portion of a substrate, wherein the source/drain region of the NMOS portion comprises at least one dislocation, and wherein a PMOS source/drain region in a PMOS portion of the substrate does not comprise a dislocation.

27 Claims, 6 Drawing Sheets

METHODS OF CHANNEL STRESS ENGINEERING AND STRUCTURES FORMED THEREBY

CROSS-REFERENCE TO RELATED APPLICATION

The present application is a divisional of U.S. patent application Ser. No. 12/316,955 filed Dec. 17, 2008.

BACKGROUND OF THE INVENTION

Optimizing stress in NMOS/PMOS transistor structures can greatly improve performance in microelectronic devices utilizing such transistors. Introducing stress into the channel regions of such transistor structures may improve device drive performance.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
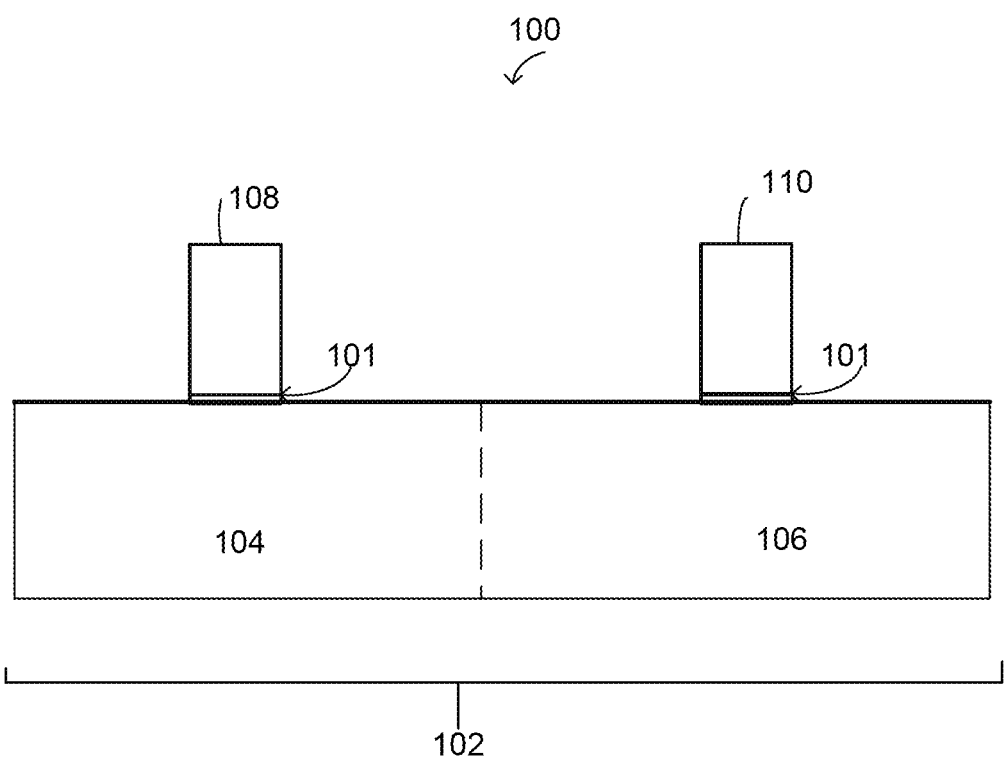
FIGS. 1a-1f represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming microelectronic structures are described. Those methods may include forming a source/drain region in an NMOS portion of a substrate, wherein the source/drain region of the NMOS portion comprises at least one dislocation, and wherein a PMOS source/drain region in a PMOS portion of the substrate does not comprise a dislocation. Methods of the present invention improve the electron mobility for NMOS devices.

FIGS. 1a-1f illustrate embodiments of methods of forming microelectronic structures, such as a transistor structure, for example. FIG. 1a illustrates a cross-section of a portion of a transistor structure 100. The transistor structure 100 may comprise a substrate 102. The substrate 102 may be comprised of materials such as, but not limited to, silicon, silicon-on-insulator, germanium, indium antimonide, lead telluride, indium arsenide, indium phosphide, gallium arsenide, gallium antimonide, or combinations thereof. The substrate 102 may comprise an n-type metal oxide semiconductor (NMOS) portion 104, and a p-type metal oxide semiconductor (PMOS) portion 106. In an embodiment, the substrate 102 may comprise a complementary metal oxide semiconductor (CMOS) transistor structure.

In an embodiment, the NMOS portion 104 of the substrate 102 may comprise an NMOS gate 108 and the PMOS portion 106 of the substrate 102 may comprise a PMOS gate 110. The NMOS gate 108 may further comprise a gate oxide 101 disposed between the NMOS gate 108 and the NMOS portion 104 of the substrate 102, and between the PMOS gate 110 and the PMOS portion 106 of the substrate 102. In an embodiment, the gate oxide 101 may comprise a high k gate oxide, wherein the dielectric constant of the gate oxide may comprise greater than about 4.0.

At least one of the PMOS and NMOS gates 110, 108 may comprise a metal gate in some embodiments, and may comprise such metal gate materials as hafnium, zirconium, titanium, tantalum, or aluminum, or combinations thereof, for example. At least one of the PMOS and NMOS gates 110, 108 may comprise polysilicon materials in some cases. The transistor structure 100 may not comprise source/drain extensions at this point in the fabrication process, in an embodiment.

Figure 1B:
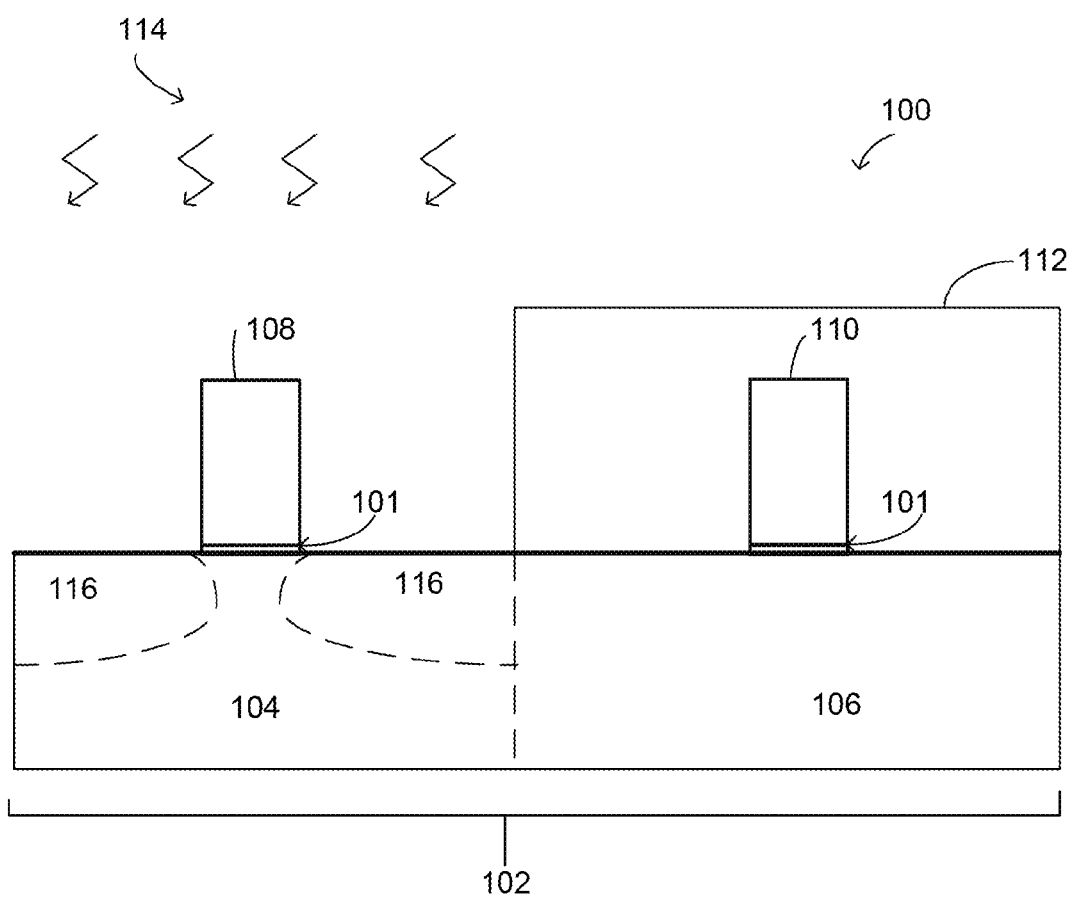

A masking material 112 may be formed on the PMOS portion 106 of the substrate 102, including the PMOS gate 110, using any suitable material, such as but not limited to a photoresist material, for example (FIG. 1b). Source/drain regions 116 of the NMOS portion 104 of the substrate 102 may be formed/amorphized using an ion implant 114 process, for example. In an embodiment, the ion implant process 114 may comprise an NMOS extension implant. A high energy implant process may be utilized to amorphize the NMOS source/drain regions 116 in an embodiment. The amorphization energy and dose of the implant process 114 may be optimized in order to achieve maximum gains for the transistor structure 100, in some embodiments.

Figure 1C:
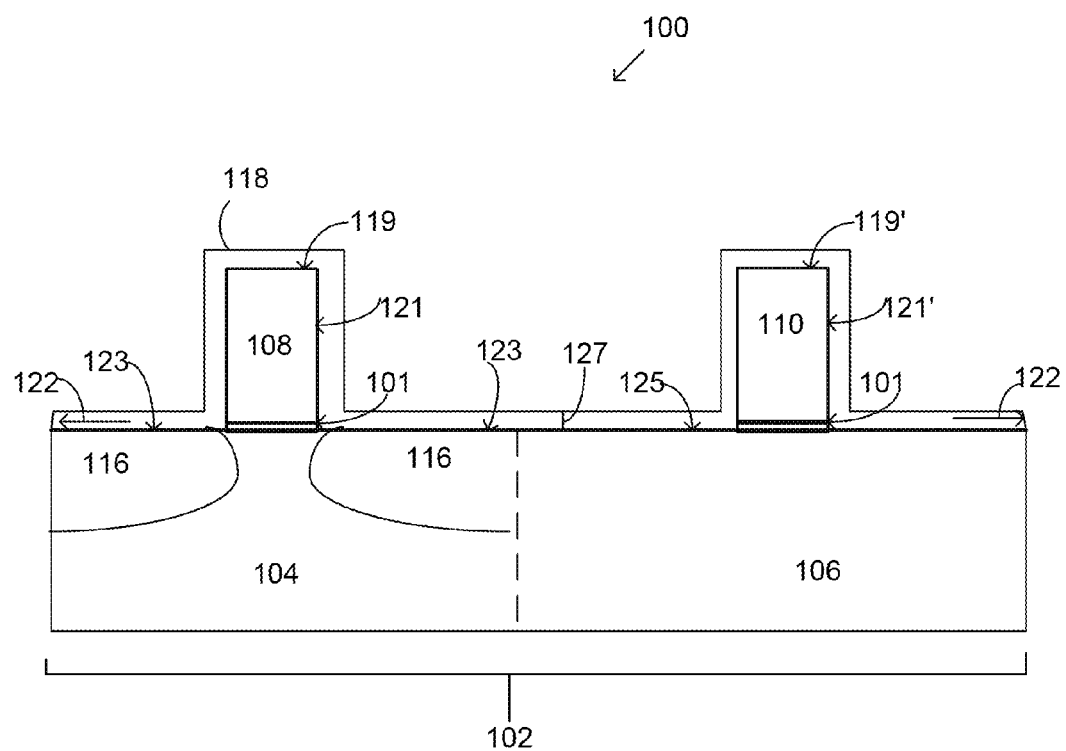

In one embodiment, a stress material 118 may be formed on a top surface 119 and on sidewalls 121 of the NMOS gate 108 and on a top surface 119' and on sidewalls 121' of the PMOS gate 110, as well as on top surfaces 123 of the source/drain regions 116 of the NMOS portion 104 of the substrate 102 and on a top surface 125 of the PMOS portion 106 of the substrate 102 (FIG. 1c). In one embodiment, the stress material 118 may comprise a dielectric material, such as but not limited to a nitride stress material 118. In one embodiment, the stress material 118 may comprises a thickness 127 of less than about 500 angstroms, for example, but may vary depending upon the particular application.

In one embodiment, the stress material 118 may comprise a dual layer, i.e., a first layer of a dielectric material disposed on a second layer of dielectric material. In one embodiment, the stress material 118 may comprise a two-film stack (for example, a silicon dioxide film with a silicon nitride formed on top). In an embodiment, the stress material 118 may comprise a stress, such as a tensile stress 122, for example. The formation of the stress material 118 may be optimized to achieve a high stress layer, and to simplify the stress material 118 removal during subsequent processing.

Figure 1D:
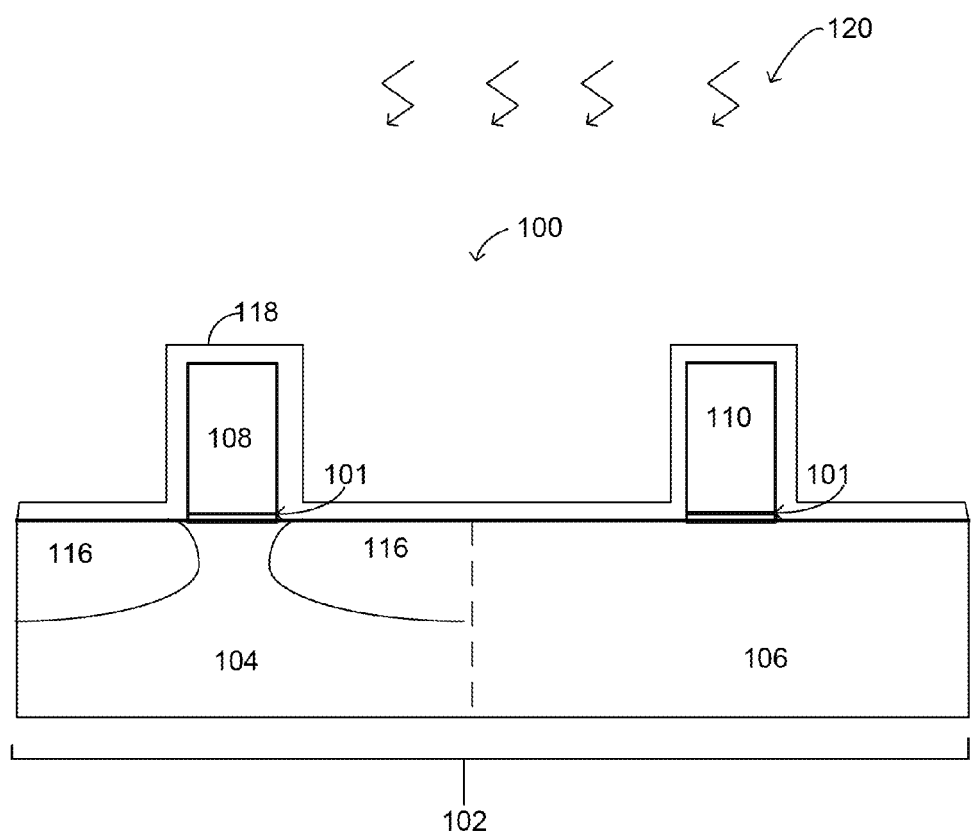
Figure 1E:
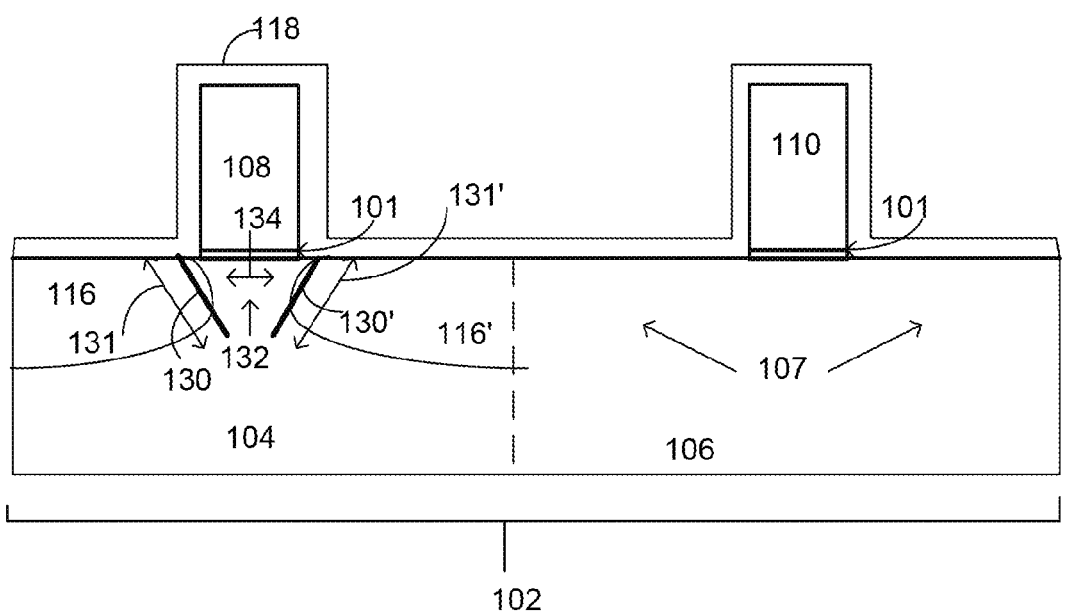

An anneal 120 may be performed on the transistor structure 100 (FIG. 1d). In an embodiment, the anneal 120 may comprise a temperature of about 600 degrees or less, but may vary depending upon the particular application. During the anneal 120, the amorphized silicon of the source/drain regions 116 may become re-grown. The stress 122 (which may comprise a tensile stress 122) from the stress material 118 may serve to modify the rate of re-growth of the amorphized silicon of the source/drain regions 116. In an embodiment, the rate of re-growth of the amorphized silicon may be modified in the plane of the substrate 102 and in a plane perpendicular to a current that may flow through the transistor structure 100. This modified re-growth of the amorphized silicon of the source/drain regions 116 may lead to the formation of a dislocation 130, such as an edge dislocation, for example (FIG. 1e).

The dislocation 130 may comprise a length 131 of less than about 50 nm in some cases. In another embodiment, the dislocation may comprise a length of between about 20 nm and about 50 nm. In an embodiment, the dislocation 130 may comprise a length 131 of greater than about 20 nm. In an embodiment, a portion of the dislocation 130 may be located in the source/drain region 116, and/or a portion of the dislocation may be located in/adjacent to a channel region 132 of the NMOS portion 104 of the substrate 102. In an embodiment, the channel region 132 may be located between a first source/drain region 116 of the NMOS portion and a second, adjacent source/drain region 116' of the NMOS portion of the substrate 102. The PMOS portion 106 of the substrate (which may include PMOS source/drain regions 107 that may be subsequently formed) does not comprise a dislocation 130, since it was not subject to modified re-growth of amorphized silicon regions.

The creation of the dislocation 130 in the silicon crystal lattice of the source/drain regions 116, 116', immediately adjacent to the channel region 132, may induce a strain/stress 134 in the channel region 132. This dislocation 130 induced strain 134 causes an increase in electron mobility for the transistor structure 100. In an embodiment, a first source/drain region 116 and a second source/drain region 116' may comprise a first dislocation 130 and a second dislocation 130' respectively. In an embodiment, the length 131 of the first dislocation 130 and the length of the second dislocation 131' may be substantially the same. The first dislocation 130 and the second dislocation 130' may induce the strain 134 into the channel region 132.

Figure 1F:
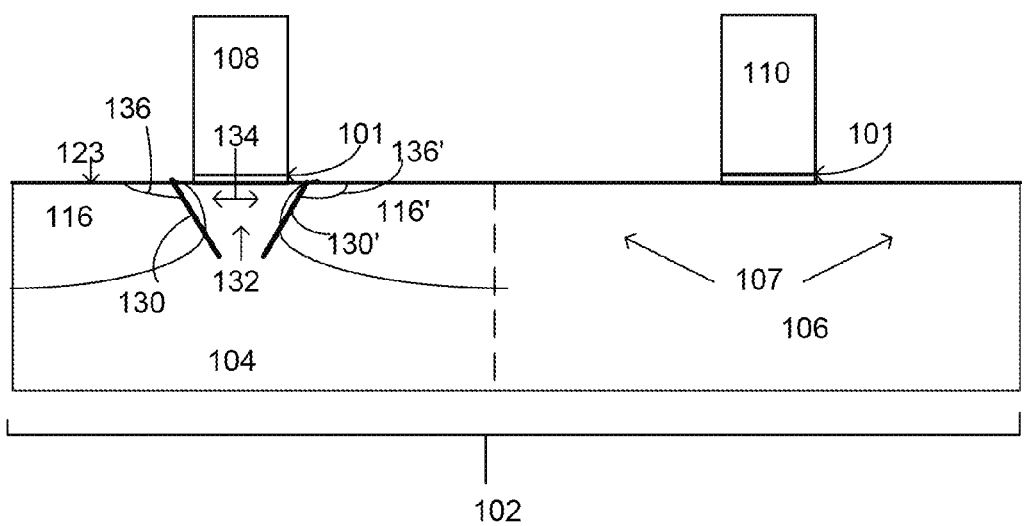

The stress material 118 may be removed from the transistor structure 100 (FIG. 1f). In an embodiment, when a silicon dioxide/silicon nitride stack structure is used for the stress material 118, the stress material 118 may be removed by using a hot phosphoric acid and subsequent hydrofluoric acids to remove the silicon nitride and silicon dioxide respectively. An angle 136 may be disposed between the dislocation 130 and the top surface 123 of the source/drain region 116, and an angle 136' may be disposed between the dislocation 130' and the top surface 123 of the source/drain region 116'. In an embodiment, the angles 136, 136' may comprise between about 30 degrees to about 60 degrees. Edge dislocations are formed on NMOS source/drain regions and not on the PMOS substrate portion 106. An optimized channel strain 134 in NMOS devices may greatly improve drive performance of such devices.

Thus, the benefits of the embodiments of the present invention include, but are not limited to, providing for channel stress engineering to enhance NMOS transistor performance. The silicon microstructure in an NMOS channel region can be engineered to improve electron mobility and therefore NMOS drive current, including short channel NMOS devices. This is achieved by creating a dislocation in the silicon crystal lattice immediately adjacent to the NMOS device channel. The dislocation induced strain in the NMOS channel results in improved electron mobility.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A structure comprising:
a source/drain region disposed in an NMOS portion of a substrate, wherein the source/drain region comprises at least one dislocation formation, the formation of the at least one dislocation is based upon a tensile stress in the NMOS portion, and wherein a PMOS source/drain region of a PMOS portion of the substrate does not comprise formation of a dislocation.

2. The structure of claim 1 wherein the at least one dislocation formation comprises an edge dislocation, and wherein the edge dislocation comprises a length of greater than about 20 nm.

3. The structure of claim 1 wherein the at least one dislocation formation is substantially adjacent to a channel region of the NMOS portion of the substrate.

4. The structure of claim 3 wherein the channel region comprises a strained channel capable of increased electron mobility.

5. The structure of claim 1 further comprising an NMOS gate disposed in the NMOS portion and a PMOS gate disposed in the PMOS portion, wherein at least one of the NMOS gate and the PMOS gate comprises a metal gate.

6. The structure of claim 1 wherein the substrate comprises a transistor structure comprising a PMOS portion and an NMOS portion.

7. The structure of claim 6 wherein the at least one dislocation formation is disposed in the substrate plane and in a plane perpendicular to a current flow of the transistor structure.

8. The structure of claim 1 wherein the structure is part of an integrated circuit.

9. A structure comprising:
a transistor substrate comprising an NMOS portion and a PMOS portion;
an NMOS gate disposed on the NMOS portion and a PMOS gate disposed on the PMOS portion, wherein a source/drain region disposed in the NMOS portion comprises at least one dislocation formation, the formation of the at least one dislocation is based upon a tensile stress in the NMOS portion, and wherein a source/drain region disposed in the PMOS portion of the substrate does not comprise formation of a dislocation; and
a strained channel region disposed in the NMOS portion, wherein the strained channel region is adjacent to the at least one dislocation.

10. The structure of claim 9 wherein the at least one dislocation formation comprises a first edge dislocation disposed in a first source/drain region of the NMOS portion of the substrate and a second edge dislocation disposed in a second source/drain region of the NMOS portion of the substrate.

11. The structure of claim 10 wherein the NMOS gate is disposed between the first source/drain region and the second source/drain region.

12. The structure of claim 10 wherein there is an angle between the first edge location and a top surface of the first source/drain, and wherein there is an angle between the second edge location and a top surface of second source/drain.

13. The structure of claim 10 wherein a length of the first edge location and a length of the second edge location are substantially the same.

14. The structure of claim 12 wherein the angle between the first edge location and the angle between the second edge location is between about 30 to about 60 degrees.

15. The structure of claim 10 wherein the first and second edge dislocations are capable of inducing strain in the strained channel.

16. The structure of claim 12 wherein the angles of the first and second edge dislocations are substantially the same.

17. The structure of claim 9 wherein the substrate comprises a CMOS transistor structure, wherein an NMOS transistor of the NMOS portion of the substrate comprises enhanced electron mobility due to the channel strain.

18. The structure of claim 9 wherein the structure is part of an integrated circuit.

19. A structure comprising:
   a transistor substrate comprising an NMOS portion and a PMOS portion;
   an NMOS gate disposed on the NMOS portion and a PMOS gate disposed on the PMOS portion, wherein a source/drain region disposed in the NMOS portion comprises at least one dislocation formation, the formation of the at least one dislocation is based upon a tensile stress in the NMOS portion, and wherein a source/drain region disposed in the PMOS portion of the substrate does not comprise formation of a dislocation; and
   a strained channel region disposed in the NMOS portion, wherein the strained channel region is adjacent to the at least one dislocation formation, wherein the at least one dislocation formation comprises a first edge dislocation disposed in a first source/drain region of the NMOS portion of the substrate and a second edge dislocation disposed in a second source/drain region of the NMOS portion of the substrate, and wherein the first and second edge dislocations comprises a length of between about 20 nm and about 50 nm, and wherein an angle is disposed between a top surface of the first source/drain region of the NMOS portion and the first edge dislocation and wherein an angle is disposed between a top surface of the second source/drain region of the NMOS portion and the second edge dislocation.

20. The structure of claim 19 wherein the NMOS gate is disposed between the first source/drain region and the second source/drain region.

21. The structure of claim 19 wherein there is an angle between the first edge location and a top surface of the first source/drain, and wherein there is an angle between the second edge location and a top surface of second source/drain.

22. The structure of claim 19 wherein a length of the first edge location and a length of the second edge location are substantially the same.

23. The structure of claim 21 wherein the angle between the first edge location and the angle between the second edge location is between about 30 to about 60 degrees.

24. The structure of claim 19 wherein the first and second edge dislocations are capable of inducing strain in the strained channel.

25. The structure of claim 21 wherein the angles of the first and second edge dislocations are substantially the same.

26. The structure of claim 19 wherein the substrate comprises a CMOS transistor structure, wherein an NMOS transistor of the NMOS portion of the substrate comprises enhanced electron mobility due to the channel strain.

27. The structure of claim 19 wherein the structure is part of an integrated circuit.

* * * * *